United States Patent
Muller et al.

(10) Patent No.: US 7,486,522 B2
(45) Date of Patent: Feb. 3, 2009

(54) AUTOMATED CIRCUIT BOARD ASSEMBLY POSITIONING SYSTEM

(75) Inventors: Ulf Muller, Backnang (DE); Willibald Konrath, Cottenweiler (DE); Klaus Scholl, Backnang (DE); Dieter Kienzle, Steinheim (DE); Lothar Ubele, Backnang (DE)

(73) Assignee: Ericsson AB, Stockholm (SE)

( * ) Notice: Subject to any disclaimer, the term of this patent is extended or adjusted under 35 U.S.C. 154(b) by 177 days.

(21) Appl. No.: 10/502,703

(22) PCT Filed: Jan. 28, 2003

(86) PCT No.: PCT/IB03/00652

§ 371 (c)(1),
(2), (4) Date: Feb. 15, 2005

(87) PCT Pub. No.: WO03/065782

PCT Pub. Date: Aug. 7, 2003

(65) Prior Publication Data

US 2005/0117311 A1     Jun. 2, 2005

(30) Foreign Application Priority Data

Jan. 28, 2002 (DE) ................. 102 03 066

(51) Int. Cl.
*H05K 1/14* (2006.01)
(52) U.S. Cl. .............. 361/737; 361/736; 361/752; 361/756; 361/759
(58) Field of Classification Search ......... 361/736–737, 361/756–759; 439/188, 60, 489
See application file for complete search history.

(56) References Cited

U.S. PATENT DOCUMENTS

| | | | | |
|---|---|---|---|---|
| 5,559,317 | A * | 9/1996 | Wong et al. | 235/449 |
| 6,059,592 | A * | 5/2000 | Inadama | 439/188 |
| 6,399,906 | B1 * | 6/2002 | Sato et al. | 200/61.59 |
| 6,557,716 | B1 * | 5/2003 | Chan | 220/9.4 |
| 6,709,281 | B2 * | 3/2004 | Shishikura et al. | 439/188 |

* cited by examiner

*Primary Examiner*—Tuan T Dinh
(74) *Attorney, Agent, or Firm*—Kirschstein et al.

(57) ABSTRACT

An automated circuit board assembly system includes at least one movable circuit board receiver that is equipped with an empty circuit board or a hybrid circuit which is transported towards an uptake location at which components are assembled to the board, and an uptake mechanism positioned at the uptake location which detects the circuit board position in preparation for the assembly process. An alignment device positions the circuit board receiver in a predetermined directional position at the uptake location.

12 Claims, 3 Drawing Sheets

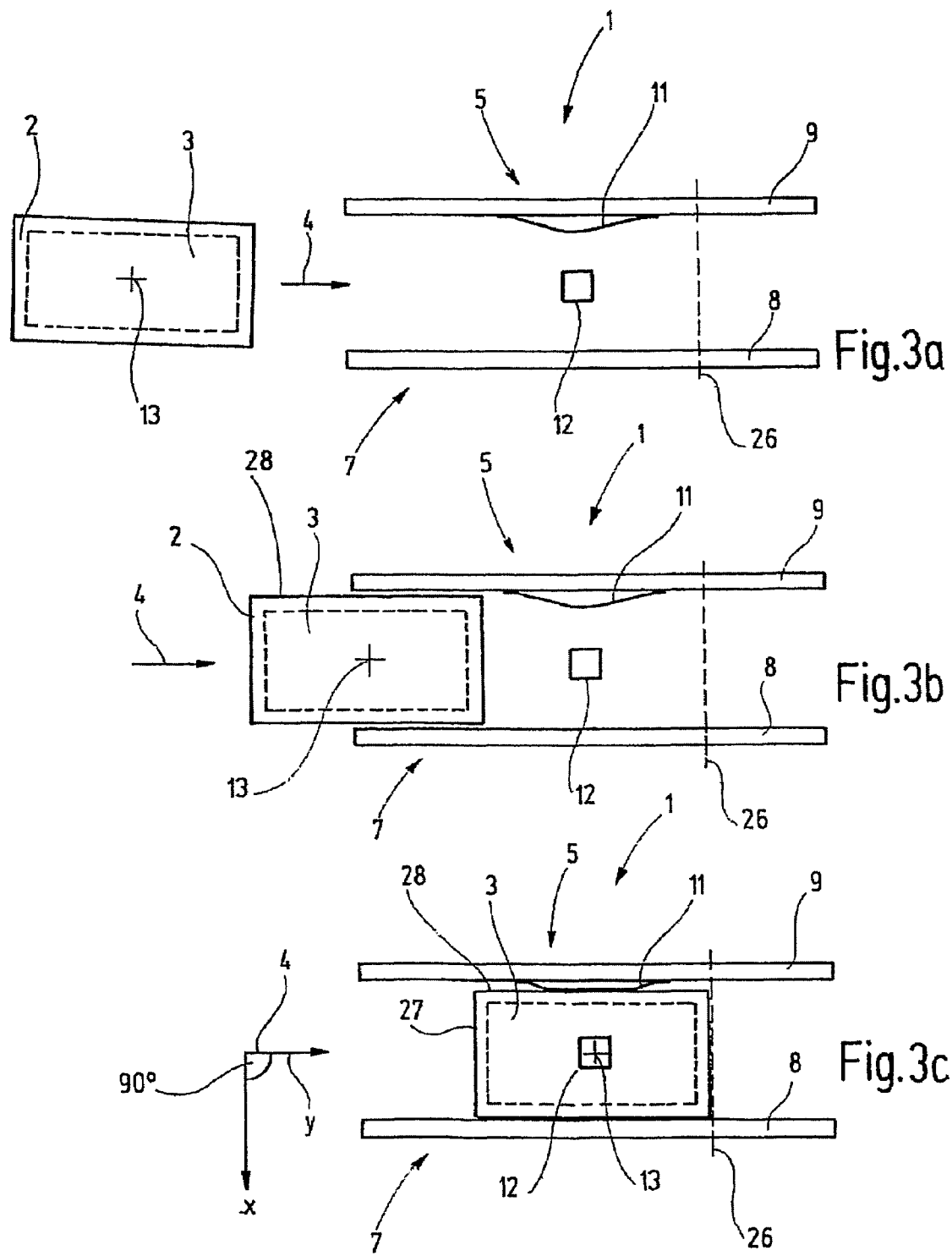

AUTOMATED CIRCUIT BOARD ASSEMBLY POSITIONING SYSTEM

The invention concerns a circuit board assembly system with at least one moveable circuit board receiver which, equipped with a circuit board, is transported to an uptake location at which components can be assembled to the board, and with an uptake mechanism which detects the circuit board position in preparation for the assembly of components to the circuit board.

PRIOR ART

Circuit board assembly systems of this type are well known to the skilled person. During the assembly of circuit boards, as well as during the manufacture of hybrids, they serve the purpose of assembling electronic components to circuit boards that are transported on circuit board receivers. A non-assembled circuit board is transported on a circuit board receiver to an uptake location where the circuit board position for the assembly process is detected with the aid of an uptake mechanism. When the board to be assembled arrives at the uptake location, the uptake mechanism raises the board. Assembly of the components generally takes place with the board raised. On completion of the assembly process, the board is lowered and proceeds on its way, allowing a subsequent board to reach the uptake location. The means by which components are assembled to the board are well known to the skilled person and will therefore not be described further. The detection of the position of the circuit board is effected by the uptake mechanism detecting alignment marks which are provided on the circuit board. Detection may for example be facilitated with the aid of a camera which monitors a search window. Positional deviations of the circuit boards at the uptake location can be detected with the aid of known circuit board assembly systems, which will for example recognise deviations caused by different alignment positions, manufacturing tolerances and/or component tolerances, for which allowance can then be made prior to the assembly process with the aid of software. However, one disadvantage consists of the fact that known circuit board assembly systems lack the necessary accuracy required for the detection of the position of the circuit boards, especially during the fitting of components with very little tolerance (especially for very small components that are, for example, utilised during the manufacture of hybrids or for radio frequency circuits) which cannot be carried out satisfactorily or only with a very substantial effort.

An object of this invention is therefore the task of providing a circuit board assembly system that will allow a more accurate positioning of circuit boards prior to the fitting thereto of components in a simple way, i.e. that will offer a higher repetitive accuracy together with an automatic recognition of alignment marks that are present on workpiece carriers that transport workpieces, and especially of circuit board carriers that transport circuit boards. It further includes the provision of a corresponding suitable process.

ADVANTAGES OF THE INVENTION

The invention seeks to solve this object by providing an alignment device that aligns the circuit board receiver at the uptake location into a predetermined directional position. The said alignment device will make it possible to align the circuit board receiver at the uptake location in a predetermined directional position, before the position of the circuit board transported by the circuit board receiver is detected with the aid of the uptake mechanism. The circuit board receivers that arrive one after the other at the assembly process position are placed in position by the alignment device with a very high repetitive accuracy, so that the circuit boards that are held by the circuit board receivers can be placed into their respective positions at the uptake location with the said high repetitive accuracy. Thanks to the almost negligible position differences of the positioned circuit boards at the uptake location, the uptake mechanism within the uptake area can be reduced in size and can therefore be operated with a higher resolution imager covering a smaller field of view than hitherto, resulting in a higher recognition accuracy, which will in turn lead to a higher accuracy during the recognition of the alignment marks on the circuit boards and the circuit board positions and will further enable a faster and more exact position detection. The component assembly process based on this position uptake can therefore also be carried out very accurately, free from errors and in a simple way. According to the invention the means by which circuit board receivers are transported to the uptake location may be implemented in any suitable manner such as, for example, a conveyor belt, on which the circuit board receivers are placed in orderly rows. The alignment device according to this invention will preferably consist of a mechanical alignment device such as an inclined lead-in member and/or of an electromagnetic alignment device, i.e. it will utilise mechanical and/or electromagnetic forces in order to cause the circuit board receivers that serve as workpiece carriers to attain a predetermined directional position.

According to a further embodiment of the invention the alignment device includes at least one fixed side stop which is co-ordinated with the circuit board receiver during or following the relevant inclined lead-in member movement. The side stop is therefore positioned—seen in the inclined lead-in member direction—at the side of the transport path of the circuit board receivers and serves as a fixed mechanical side stop for the circuit board receivers. When the already mentioned conveyor belt for example is used as the transport medium (endless moving belt) the side stop can be fixedly positioned on the machine frame at one of the longitudinal sides of the belt.

According to a further embodiment of the invention, the alignment device will include at least one positioning element that will move the circuit board against the side stop. The positioning element can be of a passive form, i.e. it may be fixedly positioned and not be driven itself, or it can consist of an active positioning element that will position the circuit board receivers transversely in relation to the inclined lead-in member axis with the aid of an actuator. This actuator can for example be operated hydraulically, pneumatically or electro-magnetically. In every case however the positioning element will ensure the predetermined directional positioning of the circuit board receiver in an x direction of a co-ordinate system that lies transverse of the inclined lead-in member y direction, in particular at an angle of 90° (Cartesian co-ordinate system).

As long as the positioning element is formed from, or incorporates, at least one inclined lead-in member that acts in a direction transverse to the inclined lead-in member axis, movement of the circuit board receiver along the inclined lead-in member will cause it to be aligned, i.e. it will move in the y direction, and will simultaneously be transported onto the positioning element and will be positioned by the said inclined lead-in member transverse to the inclined lead-in member axis and is thereby biased against the side stop, so that it can then be caused to attain a predetermined directional position in the x direction.

The supply movement of the circuit board receiver will preferably be ended by a stop device, i.e. the circuit board receiver will come to rest at the uptake location, so that the alignment mark recognition of the transported circuit board can be optimally carried out there. If the alignment mark recognition is utilised for the determination of position, the stop device will release the circuit board receiver once again in the y direction, so that an onward transport of the same can or will commence.

The inclined lead-in member mentioned above can be realised in many different ways. During this realisation it is not important that a plane, preferably a vertical plane, exists orthogonal to the direction of supply movement; multi-part forms and also non-planar forms such as for example curved forms etc. are also possible. The decisive factor is merely that the effect of a inclined lead-in member can be achieved, i.e. that the circuit board receiver can be biassed against the side stop.

It is preferable for the inclined lead-in member to be elastically deformable. This can for example be achieved by using a spring, in particular a leaf spring. Such a spring will ensure a close fitment of the relevant circuit board receiver against the side stop at the uptake location. If the said elastic deformability does exist, the distance between the inclined lead-in member and the side stop may be somewhat smaller than the width of the circuit board receiver, so that an incoming circuit board receiver will deform the inclined lead-in member to correspond with its greatest width. If the inclined lead-in member is of a non-elastic type, the said distance between the inclined lead-in member and the side stop must equal the width of the circuit board receiver, on the one hand in order to achieve as much play as possible, and on the other hand in order to avoid a trapping of the same.

Relative to the supply movement, the uptake location can be preceded by a guide channel for a rough alignment of the circuit board receivers. This guide channel will be of a width that is slightly greater than the width of the circuit board receivers, so that these, such as for example workpiece carriers with a square or rectangular base outline, being workpiece carriers that do not incorporate a circular base outline, can be roughly aligned by the channel walls, so that the predetermined directional position can be taken up at the uptake location with only very little further alignment positioning.

The invention further concerns a process for the positioning of circuit boards within a circuit board assembly system that includes at least one moveable circuit board receiver equipped with a circuit board that is transported to one uptake location, where the circuit board position is detected in preparation for the assembly process, whereby the circuit board receiver is caused to face in a predetermined directional position at the uptake location and whereby the position of the circuit board is detected in the predetermined directional position.

When the term "predetermined directional position" is sometimes used rather than the term "alignment" this is to make it clear that the predetermined directional position operation occurs prior to the assembly process which requires an absolutely accurate knowledge of the circuit board position and which therefore also requires a one hundred percent accurate circuit board positioning knowledge that can only be deduced from the recognition of the alignment marks of the circuit board at the uptake location.

DRAWINGS

The invention will now be described further with reference to the drawings, in which:

FIGS. 3a-3c show several conditions in which a circuit board carrier is supplied to an uptake location where it is aligned in a predetermined directional position according to the embodiments of FIGS. 1 and 2.

DESCRIPTION OF THE EMBODIMENTS

Figure 1:
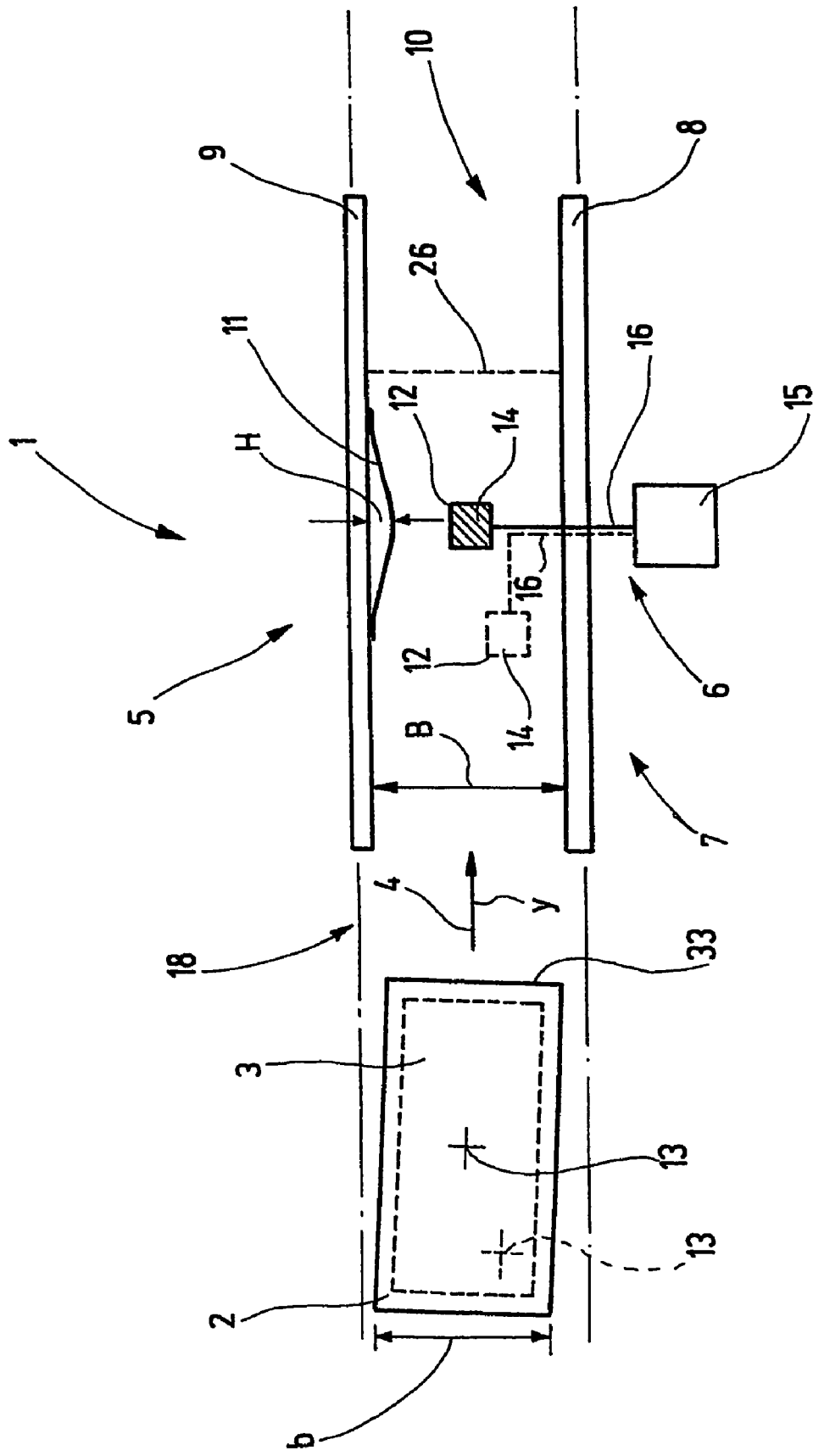
FIG. 1 shows a schematic view of a circuit board assembly system with an alignment device.

FIG. 1 shows a circuit board assembly system 1 with a moveable circuit board receiver 2, which has taken up a circuit board 3 in a reproducible position and which is being fed in the direction of the arrow 4 in the y direction towards an uptake location 5. The circuit board assembly system 1 includes an uptake mechanism 6 and an alignment device 7, which causes the supplied circuit board receiver 2 to assume a predetermined directional position at the uptake location 5. The alignment device 7, includes a side stop 8 and a guide element 9, whereby the distance between these said components is parallel and whereby a guide channel 10 for a rough alignment of the circuit board receiver 2 is formed. The alignment device 7 further includes a fixed, protecting inclined lead-in member 11 which is positioned—seen in the direction of the longitudinal orientation of the guide channel 10 (y direction)—in the central area of the guide channel 10 in such a way that the inclined lead-in member 11 is connected to the fixed guide element 9 and that it is further positioned transversely of the y direction. The numeral 18 (chain-dashed lines) represents in FIG. 1 a circuit board receiver and transport system which can for example be realised in the form of an endless conveyor belt, and on which circuit board receivers 2, equipped with circuit boards 3, are positioned and transported in the y direction towards the uptake location 5.

The uptake mechanism 6 includes a search window 12 which—seen in a longitudinal direction of the guide channel 10—is positioned at approximately the same height as the inclined lead-in member 11. The circuit board 3 is preferably affixed with a plurality, and with at least two, alignment marks 13 that are spaced apart from one another and a suitable number and arrangement of search windows 12 is envisaged in order to detect rotational position errors about the vertical axis of the circuit board 3, i.e. the circuit board receiver 2. This is illustrated in FIG. 1 with the aid of a dashed line. Each search window 12 includes an optically activated search section 14. The uptake mechanism 6 includes a central unit 15 that is operatively connected via a cable 16 with a search window 12, so that the data that is detected by a search window 12 concerning the position of the alignment mark 13, for the determination of the circuit board position can be transmitted to a central unit 15. The inclined lead-in member 11 has a width H which is slightly greater than the width B of the guide channel 10 minus the width b of the circuit board receiver 2, whereby the width B of the guide channel 10 is greater than the width b of the circuit board receiver 2, and whereby the inclined lead-in member 11 that runs transverse of the y direction is formed in an elastic and flexible way. This will be further described below.

Figure 2:
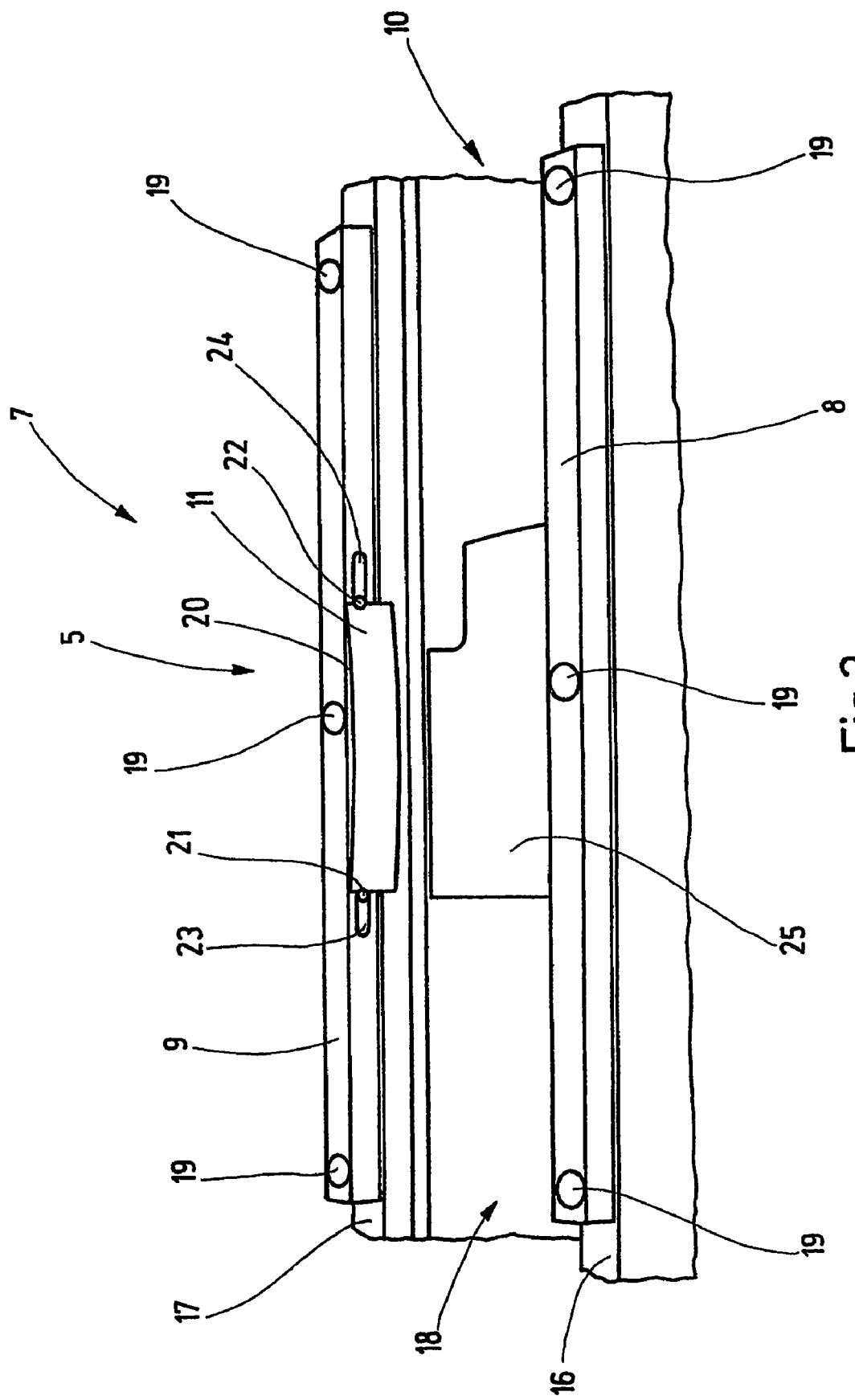
FIG. 2 shows a perspective view of the alignment device shown in FIG. 1.

FIG. 2 shows a perspective illustration of the alignment device 7. The side stop 8 and the guide element 9 are each connected with the aid of screws 19 to a wall 16, 17 of a circuit board receiver and transport system 18 that takes the form of an endless conveyor belt. The inclined lead-in member 11, which takes the form of a leaf spring 20, is fixedly connected to the guide element 9. The leaf spring 20 is of a rectangular form whose longer side is substantially longer than its shorter side. It is threadedly connected at both ends by screws 21, 22 to respective individual long holes 23, 24 of the guide element 9 in such a way that it extends in a curved manner and therefore forms the inclined lead-in member 11 that projects into the guide channel 10. At the same level the leaf spring 20 is—seen in the longitudinal direction of the guide channel 10—positioned between the two walls 16,17 of the circuit board receiver and transport system 18 together with a distancing holder 25 that does not in any way inhibit the transport and which ensures a fixed and even parallel distance between the side stop 8 and the guide element 9 in the area of the uptake location 5. A stop device 26 is further positioned—seen in the y direction—downstream from the inclined lead-in member 11, and this can be automatically inserted into and automatically removed from the transport path of the circuit board receivers 2. The stop device 26 serves to stop the relevant y movement (supply movement) of the relevant circuit board receiver 2, i.e. the circuit board receiver 2 will connect with its front wall 33 against the stop device 26 that is positioned in its stop position, whereby the circuit board receiver 2 comes to rest within the area of the uptake location 5. The circuit board receiver and transport system 18 that here takes the form of an endless conveyor belt can continue to run, i.e. it will slide underneath the stopped circuit board receiver 2.

Hereafter, the above device and the processes that can be carried out with the same for the positioning of circuit boards 3, i.e. for the detection of alignment marks on the circuit boards 3, will be described in more detail with reference to the FIGS. 3a, b and c. According to FIG. 3a a circuit board receiver 2 with a rectangular base outline is transported together with the circuit board 3 in the direction of the arrow 4 towards the uptake location 5. According to FIG. 3b the circuit board receiver 2 has already been taken up in its front area by the guide channel 10. In this guide channel 10 the circuit board receiver 2 has already been roughly aligned in comparison with the position in FIG. 3a. The circuit board receiver 2 is transported further in the direction of the arrow 4, so that it comes into contact with the inclined lead-in member 11 at the longitudinal side 28 of the circuit board receiver 2 and so that the circuit board receiver 2 is therefore displaced against the side stop 8 with its other longitudinal side 34. This displacement occurs in a transverse direction in relation to the supply direction, i.e. in the x direction, and a corresponding attainment of a predetermined directional position takes place. The circuit board receiver 27 positioned in this way is then transported further in the direction of the arrow 4 until it is placed in a stop position upon reaching the activated stop device 26, where it is then aligned in the supply direction (y direction) as well as in a transverse direction thereto (x direction) and is placed in a predetermined directional position. The directions x and y will preferably be positioned at right angles to one another. Due to this predetermined directional position the alignment mark 13 (and possibly several alignment marks) of the circuit board 3 can be detected exactly and without any substantial search effort by the search window 12 of the uptake mechanism 6, so that the uptake mechanism 6 is able to carry out a rapid detection of the circuit board position. As the position of the circuit board receiver 2 that has been achieved with the aid of the alignment device 7 and the stop device 26 can also be achieved in the same way for the subsequent circuit board receivers of the circuit board assembly system 1, a high repetition accuracy and a rapid data uptake during the detection of the circuit board position are possible.

In a modification, not shown, an actuator replaces the passive inclined lead-in member 11. The actuator can for example consist of a tappet mechanism. This will displace a circuit board receiver against the side stop 8 and in the x direction upon arrival of the receiver at the uptake location for alignment. The stop device 26 that is also present here will ensure that the circuit board receiver 2 is stopped in the y direction, so that a predetermined directional position is achieved overall at the uptake location.

The invention claimed is:

1. A circuit board assembly system, comprising: at least one movable circuit board receiver for supporting a circuit board and having at least one alignment mark; a conveyor for moving the circuit board supported by the at least one movable circuit board receiver to and past an uptake location at which components are assembled on the circuit board; an uptake mechanism for detecting a position of the circuit board in readiness for assembly of the components on the circuit board; an alignment device in which the at least one circuit board receiver is positioned in a predetermined directional position at the uptake location; and at least one search window for detecting the at least one alignment mark to determine that the at least one circuit board receiver is positioned in the predetermined directional position.

2. The circuit board assembly system according to claim 1, in that the alignment device includes at least one fixed side stop that is operated simultaneously with the at least one circuit board receiver during or after a supply movement by the conveyor.

3. The circuit board assembly system according to claim 2, in that the alignment device includes at least one positioning element for biasing the circuit board against the at least one side stop.

4. The circuit board assembly system according to claim 3, in that movement of the at least one circuit board receiver that is initiated by the at least one positioning element results in the supply movement of the at least one circuit board receiver towards the uptake location.

5. The circuit board assembly system according to claim 4, in that the at least one positioning element is positioned in a fixed way, and in that the at least one positioning element includes at least one inclined lead-in member that runs in a direction transverse of a direction of the supply movement.

6. The circuit board assembly system according to claim 4, and at least one stop device for limiting the supply movement of the at least one circuit board receiver.

7. The circuit board assembly system according to claim 4, in that, relative to the supply movement, the uptake location is preceded by a guide channel for rough alignment of the at least one circuit board receiver.

8. The circuit board assembly system according to claim 5, in that the at least one positioning element is formed from at least one actuator that is arranged to bear upon the at least one circuit board receiver in the direction transverse to the direction of the supply movement.

9. The circuit board assembly system according to claim 5, in that the at least one inclined lead-in member is elastically flexible.

10. The circuit board assembly system according to claim 5, in that the at least one inclined lead-in member comprises a spring.

11. The circuit board assembly system according to claim 5, in that a distance between the at least one inclined lead-in member and the at least one side stop does not exceed a width of the at least one circuit board receiver.

12. The circuit board assembly system according to claim 10, in that the spring comprises a leaf spring.

* * * * *

UNITED STATES PATENT AND TRADEMARK OFFICE
CERTIFICATE OF CORRECTION

PATENT NO. : 7,486,522 B2  
APPLICATION NO. : 10/502703  
DATED : February 3, 2009  
INVENTOR(S) : Muller et al.

Page 1 of 1

It is certified that error appears in the above-identified patent and that said Letters Patent is hereby corrected as shown below:

In Column 4, Line 24, delete "protecting" and insert -- projecting --, therefor.

Signed and Sealed this

Twenty-seventh Day of October, 2009

David J. Kappos  
*Director of the United States Patent and Trademark Office*